US006413647B1

(12) United States Patent
Hayashi et al.

(10) Patent No.: US 6,413,647 B1
(45) Date of Patent: Jul. 2, 2002

(54) COMPOSITION FOR FILM FORMATION, METHOD OF FILM FORMATION, AND SILICA-BASED FILM

(75) Inventors: Eiji Hayashi; Kouichi Hasegawa, both of Ibaraki (JP); Seo Youngsoo, Chungchongnam-Do (KR)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/791,619

(22) Filed: Feb. 26, 2001

(30) Foreign Application Priority Data

Feb. 28, 2000 (JP) ........................................ 2000-051136
Apr. 10, 2000 (JP) ........................................ 2000-108307

(51) Int. Cl.$^7$ ................................................ B32B 9/04
(52) U.S. Cl. .................... 428/447; 525/100; 525/102; 525/474; 524/588; 524/858; 528/21
(58) Field of Search .............. 528/10–43; 525/100–106, 525/475, 477, 474; 428/447; 524/588, 858

(56) References Cited

U.S. PATENT DOCUMENTS 5,733,644 A * 3/1998 Tanaka et al. .............. 428/215
6,037,275 A * 3/2000 Wu et al. ................... 438/780
6,342,562 B1 * 1/2002 Kozawa et al. ............. 524/588

FOREIGN PATENT DOCUMENTS

| JP | 05-263045 | * | 10/1993 |
| JP | 11-340219 | * | 12/1999 |
| JP | 2000049155 A | * | 2/2000 |

* cited by examiner

Primary Examiner—Robert Dawson
Assistant Examiner—Christopher M. Keehan
(74) Attorney, Agent, or Firm—Oblon, Spivak, McClelland, Maier & Neustadt, P.C.

(57) ABSTRACT

A composition for film formation which is capable of giving a silica-based coating film having an exceeding low dielectric constant and improved mechanical strength and useful as an interlayer insulating film in semiconductor devices and the like, a process for producing the composition, and a silica-based film obtained from the composition. The composition comprises (A) a product of hydrolysis and condensation obtained by hydrolyzing and condensing one or more silane compounds, and (B) an organic solvent.

16 Claims, No Drawings

COMPOSITION FOR FILM FORMATION, METHOD OF FILM FORMATION, AND SILICA-BASED FILM

FIELD OF THE INVENTION

The present invention relates to a composition for film formation. More particularly, the invention relates to a composition for film formation which, when used as an interlayer insulating film material in the production of semiconductor devices and the like, can give a silica-based film excellent in dielectric constant characteristics and mechanical strength.

BACKGROUND OF THE INVENTION

Silica ($SiO_2$) films formed by vacuum processes such as the CVD method have hitherto been used frequently as interlayer insulating films in semiconductor devices and other devices. In recent years, an insulating coating film which comprises a tetraalkoxysilane hydrolyzate as the main component and is called an SOG (spin on glass) film has come to be used for the purpose of forming a more even interlayer insulating film. Furthermore, as a result of the trend toward higher degree of integration in semiconductor devices and the like, an interlayer insulating film called an organic SOG film has been developed which comprises a polyorganosiloxane as the main component and has a low dielectric constant.

However, with further progress in the degree of integration or multilayer constitution in semiconductor devices and the like, better electrical insulation between conductors has come to be required and, hence, an interlayer insulating film material having a lower dielectric constant and excellent cracking resistance has come to be desired.

Proposed as materials having a low dielectric constant are a composition comprising a mixture of fine particles obtained by condensing an alkoxysilane in the presence of ammonia and a basic product of partial hydrolysis of an alkoxysilane (see JP-A-5-263045 (the term "JP-A" as used herein means an "unexamined published Japanese patent application") and JP-A-5-315319) and a coating fluid obtained by condensing a basic hydrolyzate of a polyalkoxysilane in the presence of ammonia (see JP-A-11-340219 and JP-A-11-340220). However, the materials obtained by these methods each has a dielectric constant exceeding 2.5 and has hence been insufficient for the progress of the degree of integration or multilayer constitution in semiconductor devices and the like.

SUMMARY OF THE INVENTION

One object of the invention is to provide a composition for film formation which eliminates the problem described above. More particularly, the object is to provide a composition for film formation which is capable of giving a silica-based coating film having an exceeding low dielectric constant and improved mechanical strength and useful as an interlayer insulating film in semiconductor devices and the like.

Another object of the invention is to provide a process for producing the composition.

Still another object of the invention is to provide a silica-based film obtained from the composition.

The invention provides a composition for film formation which comprises:

(A) a product of hydrolysis and condensation (hereinafter referred to also as "product of hydrolysis and condensation (A)") obtained by hydrolyzing and condensing one or more silane compounds selected from the group consisting of compounds represented by the following formula (1) (hereinafter referred to also as "compounds (1)"), compounds represented by the following formula (2) (hereinafter referred to also as "compounds (2)"), and compounds represented by the following formula (3) (hereinafter referred to also as "compounds (3)") in the presence of 0.2 mol or more of an alkaline compound per mol of the silane compounds, $$R_a Si(OR^1)_{4-a} \quad (1)$$

wherein R represents a hydrogen atom, a fluorine atom, or a monovalent organic group; $R^1$ represents a monovalent organic group; and a is an integer of 1 or 2;

$$Si(OR^2)_4 \quad (2)$$

wherein $R^2$ represents a monovalent organic group;

$$R^3{}_b(R^4O)_{3-b}Si\text{—}(R^7)_d\text{—}Si(OR^5)_{3-c}R^6{}_c \quad (3)$$

wherein $R^3$ to $R^6$ may be the same or different and each represents a monovalent organic group; b and c may be the same or different and each is a number of 0 to 2; $R^7$ represents an oxygen atom, a phenylene group, or a group represented by —$(CH_2)_n$—, wherein n is an integer of 1 to 6; and d is 0 or 1; and (B) an organic solvent.

The invention further provides a method of film formation which comprises applying the composition for film formation described above to a substrate and then heating the resultant coating.

The invention furthermore provides a silica-based film obtained by the method of film formation described film.

DETAILED DESCRIPTION OF THE INVENTION

The product of hydrolysis and condensation (A) in the invention means a mixture of a hydrolyzate of at least one member selected from the group consisting of the compounds (1) to (3) and a condensate of the hydrolyzate, or means either of the hydrolyzate and the condensate.

In the hydrolyzate in ingredient (A) all the $R^1O$—, $R^2O$—, $R^4O$—, and $R^5O$— groups contained in compounds (1) to (3) to constitute ingredient (A) need not have been hydrolyzed. For example, the hydrolyzate may be one in which only one of those groups has been hydrolyzed or two or more thereof have been hydrolyzed or may be a mixture of these.

The condensate in ingredient (A) means a product formed from the hydrolyzate of compounds (1) to (3) to constitute ingredient (A) by condensing silanol groups of the hydrolyzate to form Si—O—Si bonds. In the invention, however, all the silanol groups need not have undergone condensation. Namely, the term "condensate" as used herein means a concept which includes, for example, a condensate in which a slight proportion of the silanol groups have been condensed and a mixture of condensates which differ in the degree of condensation.

Product of Hydrolysis and Condensation (A)

The product of hydrolysis and condensation (A) is obtained by hydrolyzing and condensing, in the presence of a specific amount of an alkaline compound, at least one silane compound selected from the group consisting of compounds (1) to (3).

Compounds (1)

Examples of the monovalent organic groups represented by R and $R^1$ in formula (1) include alkyl, aryl, allyl, and glycidyl groups. In formula (1), R is preferably a monovalent organic group, more preferably an alkyl or phenyl group.

The alkyl group preferably has 1 to 5 carbon atoms, and examples thereof include methyl, ethyl, propyl, and butyl. These alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Specific examples of the compounds (1) include: trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Preferred examples of the compounds (1) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or as a mixture of two or more thereof.

Compounds (2)

Examples of the monovalent organic group represented by $R^2$ in formula (2) include the same organic groups as those enumerated above with regard to formula (1).

Examples of the compounds (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3)

Examples of the monovalent organic groups represented by $R^3$ to $R^6$ in formula (3) include the same organic groups as those enumerated above with regard to formula (1).

Examples of the compounds (3) wherein $R^7$ in formula (3) is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3 -pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3- dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3,-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane.

Preferred of those compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compounds represented by formula (3) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (3) wherein $R^7$ is a group represented by —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)methane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, and 1,4-bis(tri-t-butoxysilyl)benzene.

Preferred of those compounds are bis(trimethoxysilyl)methane, bis(triethoxysilyl)methane, 1,2-bis(trimethoxysilyl)ethane, 1,2 -bis(triethoxysilyl)ethane, 1-(dimethoxymethylsilyl)-1-(trimethoxysilyl)methane, 1-(diethoxymethylsilyl)1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis (triethoxysilyl)benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

In the invention, the compounds (1), (2), and (3) described above may be used alone or in combination of two or more thereof to constitute ingredient (A).

When at least one silane compound selected from the group consisting of the compounds (1) to (3) as materials for ingredient (A) is hydrolyzed and condensed, water is preferably used in an amount of from more than 20 mol to 150 mol per mol of the at least one compound selected from the compounds (1) to (3). If water is added in an amount of 20 mol or smaller, there are cases where a sufficient dielectric constant and a sufficient modulus of elasticity are not obtained. On the other hand, if the amount of water added is larger than 150 mol, there are cases where polymer precipitation or gelation occurs during the hydrolysis and condensation reactions.

The production of the product of hydrolysis and condensation (A) for use in the invention is characterized in that a specific amount of an alkaline compound is used in hydrolyzing and condensing at least one silane compound selected from the group consisting of the compounds (1) to (3).

In the invention, a silica-based film having a low dielectric constant and a high modulus of elasticity can be obtained by using an alkaline compound in an amount not smaller than a specific value.

Examples of alkaline compounds which can be used in the invention include ammonia (including aqueous ammonia solutions), organic amines, and alkaline inorganic compounds. However, ammonia and organic amines are preferred in the invention.

Examples of the organic amines for use in the invention include alkylamines, alkanolamines, and arylamines.

Examples of the alkylamines usable in the invention include: compounds having one or more alkyl groups having 1 to 4 carbon atoms, such as methylamine, ethylamine, propylamine, butylamine, hexylamine, octylamine, N,N-dimethylamine, N,N-diethylamine, N,N-dipropylamine, N,N-dibutylamine, trimethylamine, triethylamine, tripropylamine, and tributylamine; and compounds having an alkoxy group, such as methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, and butoxybutylamine.

Examples of the alkanolamines include methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, and N-(aminobutyl)butanolamine.

Examples of the arylamines include aniline.

Other examples of the organic amines include tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, and diazabicycloundecene.

Those alkaline compounds may be used alone or as a mixture of two or more thereof.

From the standpoint of adhesion of the silica-based film to substrates, it is preferred to use an alkylamine as the alkaline compound in the invention.

In the invention, the alkaline compound is used in an amount of 0.2 mol or larger, preferably 0.9 mol or larger, per mol of the total amount of the compounds (1) to (3).

Although there is no particular upper limit on the amount of the alkaline compound to be used in the invention, the upper limit thereof is usually less than 10 mol per mol of the silane compounds.

The radius of gyration of the product of hydrolysis and condensation (A) thus obtained is preferably from 5 to 50 nm, more preferably from 8 to 40 nm, most preferably from 9 to 30 nm, in terms of radius of gyration determined by the GPC (refractive index, viscosity, or light scattering) method. When the product of hydrolysis and condensation has a radius of gyration of from 5 to 50 nm, the composition can give a silica-based film excellent especially in dielectric constant, modulus of elasticity, and evenness of the film.

The product of hydrolysis and condensation (A) thus obtained is characterized by being not particulate and hence having excellent applicability to substrates. That the product of hydrolysis and condensation (A) is not particulate can be ascertained through examination with, e.g., a transmission electron microscope (TEM).

In ingredient (A), the proportion of the product of hydrolysis and condensation derived from each compound is as follows, in terms of the product of complete hydrolysis and condensation. The content of the product of hydrolysis and condensation derived from the compound (2) is generally from 5 to 75% by weight, preferably from 10 to 70% by weight, more preferably from 15 to 70% by weight, based on the sum of all the products of hydrolysis and condensation derived from the compounds (1) to (3). The content of the product of hydrolysis and condensation derived from the compound (1) and/or compound (3) is generally from 95 to 25% by weight, preferably from 90 to 30% by weight, more preferably from 85 to 30% by weight, based on the sum of all the products of hydrolysis and condensation derived from the compounds (1) to (3). When the content of the product of hydrolysis and condensation derived from the compound (2) is from 5 to 75% by weight based on the sum of all the products of hydrolysis and condensation derived from the compounds (1) to (3), then the coating film obtained has a high modulus of elasticity and an exceedingly low dielectric constant.

The term "product of complete hydrolysis and condensation" as used herein means a product in which all the $R^1O$—, $R^2O$—, $R^4O$—, and $R^{50}$— groups contained in the compound (1), (2), or (3) have been hydrolyzed into SiOH groups and then completely condensed to form siloxane structures.

Ingredient (A) is preferably a product of the hydrolysis and condensation of a mixture of at least one of the compounds (1) and at least one of the compounds (2), because this ingredient (A) imparts better storage stability to the composition to be obtained.

In producing a product of hydrolysis and condensation (A), at least one silane compound selected from the group consisting of compounds (1) to (3) is hydrolyzed and condensed in the presence of an alkylamine so that the resultant product of hydrolysis and condensation preferably has a radius of gyration of from 5 to 50 nm. It is preferred to adjust the pH of the resultant composition to 7 or lower.

Examples of techniques for pH adjustment include:
(1) to add a pH regulator;
(2) to distill off the alkali catalyst from the composition at ordinary or reduced pressure;
(3) to bubble a gas such as nitrogen or argon into the composition to thereby remove the alkali catalyst from the composition; and
(4) to remove the alkali catalyst from the composition with an ion-exchange resin.

Those techniques may be used alone or in combination of two or more thereof.

Examples of the pH regulator include inorganic acids and organic acids.

Examples of the inorganic acids include hydrochloric acid, nitric acid, sulfuric acid, hydrofluoric acid, phosphoric acid, boric acid, and oxalic acid.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, malic acid, itaconic acid, citraconic acid, mesaconic acid, crotonic acid, and glutaric acid.

Such a pH regulator is used to adjust the pH of the composition to 7 or lower, preferably 1 to 6. The method described above which comprises regulating the radius of gyration of the product of hydrolysis and condensation to from 5 to 50 nm and then adjusting the pH thereof with the pH regulator to a value within that range produces the effect that the composition obtained has improved storage stability.

The pH regulator is used in an amount suitably selected so that the pH of the composition becomes a value within that range.

Organic Solvent (B)

The composition for film formation of the invention comprises ingredient (A) usually dissolved or dispersed in an organic solvent (B).

This organic solvent (B) may comprise at least one member selected from the group consisting of alcohol solvents, ketone solvents, amide solvents, ester solvents, and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecylalcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Preferred of those alcohols are n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, propylene glycol monomethyl ether, propylene glycol monoethyl ether, propylene glycol monopropyl ether, and propylene glycol monobutyl ether.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholine, N-methylpyrrole, N-ethylpyrrole, N-methyl-$\Delta^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

The organic solvents (B) enumerated above can be used alone or as a mixture of two or more thereof.

Preferred of those organic solvents are alcohol solvents.

In producing the composition for film formation of the invention, the same organic solvents can be used for the hydrolyzing and condensing the compounds (1) to (3) as materials for ingredient (A).

Specifically, water or solvent-diluted water is added intermittently or continuously to a solvent containing the compounds (1) to (3) dissolved therein. In this operation, an alkaline compound may be added beforehand to the solvent or may be dissolved or dispersed in the water prior to the addition of the water. The reaction temperature in this case is generally from 0 to 100° C., preferably from 15 to 90° C.

Other Additives

Ingredients such as surfactants, colloidal silica, and colloidal alumina may be added to the composition for film formation of the invention.

The surfactants for use in the invention are not particularly limited. Examples thereof include silicone surfactants, cationic surfactants, anionic surfactants, nonionic surfactants, amphoteric surfactants, fluorochemical surfactants, and acrylic surfactants. Such surfactants can be used alone or in combination of two or more thereof.

Preferred surfactants are silicone, nonionic, fluorochemical, and acrylic surfactants. Especially preferred of these are silicone surfactants because they are effective in imparting excellent film-forming properties and do not generate a gas which corrodes metals.

The silicone surfactants are not particularly limited. Examples thereof include dimethylpolysiloxane-polyoxyalkylene copolymers.

Commercially available products of silicone surfactants include organosiloxane polymer KP341 (manufactured by Shin-Etsu Chemical Co., Ltd.) and SH7PA, SH21PA, SH28PA, SH30PA, and ST94PA (all manufactured by Dow Corning Toray Silicone Co., Ltd.).

Examples of the cationic surfactants include alkylamine salts, quaternary ammonium salts, and polyoxyalkylamines.

Examples of the anionic surfactants include fatty acid salts, higher alcohol sulfates, alkylbenzenesulfonates, (diphenyl ether)disulfonates, dialkyl disulfosuccinates, alkyl phosphate salts, and polyoxyethylene sulfate salts.

The nonionic surfactants are not particularly limited. Examples thereof include polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether and polyoxyethylene nonylphenyl ether; polyoxyethylene dialkyl esters such as polyoxyethylene dilaurate and polyoxyethylene distearate; sorbitan fatty acid esters; fatty-acid-modified polyoxyethylenes; and polyoxyethylene-polyoxypropylene block copolymers.

The amphoteric surfactants are not particularly limited. Examples thereof include surfactants having a structure comprising a combination of two or more different kinds of surfactants selected from the anionic surfactants, cationic surfactants, and nonionic surfactants enumerated above.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di (1,1,2,2-tetrafluorobutyl) ether, hexaethylene glycol (1,1,2,2,3,3-hexafluoropentyl) ether, octapropylene glycol di(1,1,2,2-tetrafluorobutyl) ether, hexapropylene glycol di(1,1,2,2,3,3-hexafluoropentyl) ether, sodium perfluorododecanesulfonate, 1,1,2,2,8,8,9,9,10,10-decafluorododecane, 1,1,2,2,3,3-hexafluorodecane, N-[3-perfluorooctanesulfonamido)propyl]-N,N'-dimethyl-N-carboxymethylene ammonium betaine, perfluoroalkylsulfonamidopropyltrimethyl ammonium salts, perfluoroalkyl-N-ethylsulfonyl glycine salts, bis(N-perfluorooctylsulfonyl-N-ethylaminoethyl) phosphate, and monoperfluoroalkylethyl phosphates.

Commercially available products of such fluorochemical surfactants include products available under the trade names of Megafac F142D, F172, F173, and F183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710 and Surflon S-382, SC-101, SC-102, SC-103, SC-104, SC-105, and SC-106 (manufactured by Asahi Glass Co., Ltd.); BM-1000 and BM-1100 (manufactured by Yusho K. K.); and NBX-15 (manufactured by NEOS Co., Ltd.). Especially preferred of these are Megafac F172, BM-1000, BM-1100, and NBX-15.

Examples of the acrylic surfactants which can be used in the invention include (meth)acrylic acid copolymers. Such acrylic surfactants are commercially available under the trade names of Polyflow No.57 and No.95, manufactured by Kyoeisha Chemical Co., Ltd.

The colloidal silica is a dispersion comprising, for example, any of the aforementioned hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd., and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Methods for Preparing the Composition for Film Formation

The composition for film formation of the invention may be prepared, for example, by mixing compounds (1) to (3) in a solvent, adding water thereto continuously or intermittently, and conducting hydrolysis and condensation to prepare ingredient (A).

Specific examples of methods for preparing the composition of the invention include the following methods (1) to (4).

(1) A method in which a given amount of water is added to a mixture comprising compounds (1) to (3) for constituting ingredient (A), an alkaline compound, and an organic solvent (B) to conduct hydrolysis and condensation reactions.

(2) A method in which a given amount of water is added continuously or intermittently to a mixture comprising compounds (1) to (3) for constituting ingredient (A), an alkaline compound, and an organic solvent (B) to conduct hydrolysis and condensation reactions.

(3) A method in which given amounts of water and an alkaline compound are added to a mixture comprising compounds (1) to (3) for constituting ingredient (A) and an organic solvent (B) to conduct hydrolysis and condensation reactions.

(4) A method in which given amounts of water and an alkaline compound are added continuously or intermittently to a mixture comprising compounds (1) to (3) for constituting ingredient (A) and an organic solvent (B) to conduct hydrolysis and condensation reactions.

The organic solvent to be used in hydrolyzing and condensing compounds (1) to (3) in the invention are preferably alcohols having up to 4 carbon atoms, such as methanol, ethanol, and isopropanol.

After completion of the hydrolysis and condensation, concentration adjustment and solvent replacement are conducted according to need. Thus, the composition of the invention is prepared.

The composition of the invention thus obtained has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

The total solid concentration of the composition is regulated, according to need, by means of concentration or dilution with the organic solvent (B).

In forming a film from the composition of the invention, the composition of the invention is first applied to a substrate to form a coating film.

Examples of the substrate to which the composition of the invention is applicable include semiconductors, glasses, ceramics, and metals.

Examples of coating techniques that can be used include spin coating, dipping, and roller blade coating.

The composition of the invention is especially suitable for use in an application in which the composition is applied to a silicon wafer, $SiO_2$ wafer, SiN wafer, or the like to form an insulating film.

This coating operation can be conducted so as to form a coating film having a thickness on a dry basis of about from 0.05 to 1.5 $\mu$m in the case of single coating or about from 0.1 to 3 $\mu$m in the case of double coating.

In general, the thickness of the coating film to be formed is from 0.2 to 20 $\mu$m.

In this operation, heating can be conducted with a hot plate, oven, furnace, or the like, for example, in the air, in a nitrogen or argon atmosphere, under vacuum, or under reduced pressure having a controlled oxygen concentration.

In order to control the curing rate of the ingredient (A), stepwise heating or a suitably selected atmosphere, such as a nitrogen, air, oxygen, or reduced-pressure atmosphere, can be used according to need.

The silica-based film of the invention thus obtained has a density of generally from 0.35 to 1.2 $g/cm^3$, preferably from 0.4 to 1.1 $g/cm^3$, more preferably from 0.5 to 1.0 $g/cm^3$. If the density of the film is lower than 0.35 $g/cm^3$, the coating film has impaired mechanical strength. On the other hand, if the density thereof exceeds 1.2 $g/cm^3$, a low dielectric constant cannot be obtained.

When the silica-based film of the invention is examined for pore size distribution by the BJH method, no pores of 10 nm or larger are observed therein. The film is hence suitable for use as an interlayer insulating film material for insulation between fine wirings.

Furthermore, the silica-based film of the invention is characterized by having low water absorption. For example, when the coating film is allowed to stand in an atmosphere of 127° C., 2.5 atm, and 100% RH for 1 hour, then no water adsorption on the coating film is observed by IR spectroscopy.

This water absorption can be regulated by controlling the amount of a tetraalkoxysilane used in the invention as a compound (1) in preparing the composition for film formation.

The silica-based film of the invention has a dielectric constant as low as generally from 2.5 to 1.2, preferably from 2.4 to 1.2.

The low-density coating film of the invention has excellent insulating properties and is excellent also in evenness, dielectric characteristics, cracking resistance, and surface hardness. Consequently, this coating film is useful in applications such as interlayer insulating films for semiconductor devices such as LSIs, system LSIs, DRAMs, SDRAMs, RDRAMs, and D-RDRAMs, protective films such as surface coat films for semiconductor devices, interlayer insulating films for multilayered printed circuit boards, and protective or insulating films for liquid-crystal display devices.

The invention will be explained below in more detail by reference to the following Examples. However, the following description merely shows general embodiment examples of the invention, and it should be understood that the invention is not construed as being limited by the description without particular reasons.

In the following Examples and Reference Examples, all "parts" and "percents" are by weight unless otherwise indicated.

Various properties were evaluated by the following methods.

Radius of Gyration

Measured by gel permeation chromatography (GPC) (refractive index, viscosity, or light scattering measurement) under the following conditions.

Sample solution: A product of the hydrolysis and condensation of silane compounds was diluted with methanol containing 10 mM LiBr to a solid concentration of 0.25% to prepare a sample solution for GPC (refractive index, viscosity, or light scattering measurement).

Apparatus:

GPC system: Model GPC-8020, manufactured by Tosoh Corp.

Column: Alpha 5000/3000, manufactured by Tosoh Corp.

Viscosity detector and light scattering detector:

Model T-60 Dual Meter, manufactured by Visco Tech Co.

Carrier solution: methanol containing 10 mM LiBr

Carrier feed rate: 1 ml/min

Column temperature: 40° C.

Dielectric Constant

A sample for dielectric constant measurement was produced by forming an aluminum electrode pattern by vapor deposition on a film obtained.

This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Modulus of Elasticity (Young's Modulus)

A film obtained was examined with Nanoindenter XP (manufactured by Nano Instrument Inc.) by a continuous method for rigidity measurement.

EXAMPLE 1

To a solution prepared by mixing 6 g of 40% aqueous methylamine solution, 228 g of ultrapure water, and 570 g of ethanol were added 13.6 g of methyltrimethoxysilane and 20.9 g of tetraethoxysilane. This mixture was reacted at 60° C. for 2 hours, and 200 g of propylene glycol monopropyl ether was then added thereto. The resultant mixture was concentrated under reduced pressure until the total amount thereof decreased to 116 g. Subsequently, 10 g of a 10% acetic acid solution in propylene glycol monopropyl ether was added to the concentrate to obtain a composition solution having a solid content of 10%.

The product of hydrolysis and condensation contained in the composition solution obtained had a radius of gyration of 12 nm.

EXAMPLE 2

The same procedure as in Example 1 was conducted, except that 98 g of 25% aqueous ammonia solution was used in place of the 6 g of 40% aqueous methylamine solution. Thus, a composition solution having a solid content of 10% was obtained.

The product of hydrolysis and condensation contained in the composition solution obtained had a radius of gyration of 14 nm.

EXAMPLE 3

To a solution prepared by mixing 27 g of 40% aqueous methylamine solution, 137 g of ultrapure water, and 342 g of ethanol were added 13.6 g of methyltrimethoxysilane and 28.7 g of tetraethoxysilane. This mixture was reacted at 60° C. for 2 hours, and 200 g of propylene glycol monopropyl ether was then added thereto. The resultant mixture was concentrated under reduced pressure until the total amount thereof decreased to 116 g. Subsequently, 10 g of a 10% acetic acid solution in propylene glycol monopropyl ether was added to the concentrate to obtain a composition solution having a solid content of 10%.

The product of hydrolysis and condensation contained in the composition solution obtained had a radius of gyration of 26 nm.

Reference Example 1

The same procedure as in Example 1 was conducted, except that 1 g of 25% aqueous ammonia solution was used in place of the 6 g of 40% aqueous methylamine solution. Thus, a composition solution having a solid content of 10% was obtained.

The product of hydrolysis and condensation contained in the composition solution obtained had a radius of gyration of 8 nm.

Reference Example 2

The same procedure as in Example 1 was conducted, except that the amount of the ultrapure water to be used was changed to 14 g. Thus, a composition solution having a solid content of 10% was obtained.

The product of hydrolysis and condensation contained in the composition solution obtained had a radius of gyration of 4 nm.

Reference Example 3

The same procedure as in Example 1 was conducted, except that the amount of the ultrapure water to be used was changed to 690 g. However, polymer precipitation occurred during the reaction.

Film Formation

The compositions obtained in Examples 1 to 3 and Reference Examples 1 and 2 each was applied to an 8-inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent silica-based film. The silica-based films thus obtained were subjected to the evaluations described above. The results obtained are shown in Table 1.

TABLE 1

|  | Example 1 | Example 2 | Example 3 | Reference Example 1 | Reference Example 2 |
|---|---|---|---|---|---|
| Dielectric constant | 2.3 | 2.2 | 2.0 | 2.6 | 2.9 |
| Modulus of elasticity (GPa) | 5.5 | 5.0 | 4.0 | 2.8 | 2.0 |

Synthesis Example 1

Into a separable flask made of quartz were introduced 5,700 g of distilled ethanol, 1,600 g of ion-exchanged water, and 1,300 g of 10% aqueous ammonia solution. The contents were stirred and homogenized. To this solution was added over 30 minutes a mixture of 136 g of methyltrimethoxysilane and 209 g of tetraethoxysilane. The resultant solution was reacted for 2 hours while being kept at 55° C. To this solution was added 3,000 g of propylene glycol monopropyl ether. Subsequently, the resultant solution was concentrated with a 50° C. evaporator until the concentration thereof reached 10% (in terms of the content of the product of complete hydrolysis and condensation). Thereafter, 10 g of a 10% acetic acid solution in propylene glycol monopropyl ether was added to the concentrate to obtain a reaction mixture (1).

The product of condensation and other reactions thus obtained had a radius of gyration of 14.4 nm.

Synthesis Example 2

The same procedure as in synthesis example 1 was conducted, except that the amount of the ion-exchanged water was changed from 1,600 g to 260 g. Thus, a reaction mixture (2) was obtained.

The product of condensation and other reactions thus obtained had a radius of gyration of 13.4 nm.

Synthesis Example 3

The same procedure as in synthesis example 1 was conducted, except that the amount of the ion-exchanged water was changed from 1,600 g to 3,150 g. Thus, a reaction mixture (3) was obtained.

The product of condensation and other reactions thus obtained had a radius of gyration of 15.2 nm.

Synthesis Example 4

The same procedure as in synthesis example 1 was conducted, except that 1,300 g of 10% aqueous methylamine solution was used in place of the 1,300 g of 10% aqueous ammonia solution. Thus, a reaction mixture (4) was obtained.

The product of condensation and other reactions thus obtained had a radius of gyration of 15.4 nm.

EXAMPLE 4

The reaction mixture (1) obtained in Synthesis Example 1 was filtered through a Teflon filter having an opening diameter of 0.2 μm to obtain a composition for film formation of the invention.

The composition obtained was applied to a silicon wafer by spin coating, and the coating film formed was evaluated for dielectric constant by the same method as described above and further evaluated for other properties by the following methods. The results obtained are shown in Table 2.

Cracking Resistance

The composition sample was applied to an 8-inch silicon wafer by spin coating in such an amount as to result in a cured coating film having a thickness of 1.0 μm. This coating film was dried first at 90° C. on a hot plate for 3 minutes and then at 200° C. in a nitrogen atmosphere for 3 minutes. Subsequently, the coated substrate was burned on a 400° C. hot plate in an argon atmosphere for 30 minutes. The coating film obtained was partly incised with a knife and then immersed in pure water for 1 hour. Thereafter, the incision of the coating film was examined with a microscope to evaluate cracking resistance based on the following criteria.

○: No crack propagation was observed.

×: Crack propagation was observed.

Resistance of Coating Film to CMP

The composition sample was applied to an 8-inch silicon wafer by spin coating. The coated substrate was dried first at 90° C. on a hot plate for 3 minutes and subsequently at 200° C. in a nitrogen atmosphere for 3 minutes, and was then burned on a 400° C. hot plate in an argon atmosphere for 30 minutes. The coating film obtained was polished under the following conditions.

Slurry: silica-hydrogen peroxide system

Polishing pressure: 200 g/cm$^2$

Polishing time: 40 seconds

After the CMP, the appearance of the coating film was examined with a lamp for surface examination at an illuminance of 350,000 lx to evaluate CMP resistance based on the following criteria.

○: No change.

×: Mars or peeling was observed in the coating film.

Adhesion of Coating Film

The composition sample was applied to an 8-inch silicon wafer by spin coating. The coated substrate was dried first at 90° C. on a hot plate for 3 minutes and subsequently at 200° C. in a nitrogen atmosphere for 3 minutes, and was then burned on a 400° C. hot plate in an argon atmosphere for 30 minutes. Ten stud pins were fixed to the resultant coated substrate with an epoxy resin. After the epoxy resin applied was cured at 150° C. for 1 hour, the stud pins were pulled out by the Sebastian method to evaluate the adhesion of the coating film based on the following criteria.

○: No peeling occurred between the silicon wafer and the coating film with respect to each of the ten stud pins.

×: Peeling occurred between the silicon wafer and the coating film.

EXAMPLES 5 TO 7

Compositions for film formation were prepared in the same manner as in Example 4, except that each of the reaction mixtures shown in Table 2 was used in place of reaction mixture (1). The compositions obtained were evaluated in the same manner as in Example 4. The results of the evaluations are shown in Table 2.

TABLE 2

| Example | Reaction mixture | Dielectric constant of coating film | Cracking resistance of coating film | CMP resistance of coating film | Adhesion of coating film |
|---|---|---|---|---|---|
| 4 | Reaction mixture (1) | 2.19 | ○ | ○ | ○ |
| 5 | Reaction mixture (2) | 2.25 | ○ | ○ | ○ |
| 6 | Reaction mixture (3) | 2.16 | ○ | ○ | ○ |
| 7 | Reaction mixture (4) | 2.14 | ○ | ○ | ○ |

According to the invention, a composition for film formation can be provided which is capable of forming a silica-based film having a sufficiently low dielectric constant and improved mechanical strength.

What is claimed is:

1. A composition for film formation which comprises:
   (A) a product of hydrolysis and condensation obtained by hydrolyzing and condensing one or more silane compounds selected from the group consisting of compounds represented by the following formula (1), compounds represented by the following formula (2), and compounds represented by the following formula (3) in the presence of 0.2 mol or more of an alkaline compound per mol of the silane compounds, $$R_a Si(OR^1)_{4-a} \tag{1}$$

wherein R represents a hydrogen atom, a fluorine atom, or a monovalent organic group; $R^1$ represents a monovalent organic group; and a is an integer of 1 or 2;

$$Si(OR^2)_4 \tag{2}$$

wherein $R^2$ represents a monovalent organic group;

$$R^3{}_b(R^4O)_{3-b}Si-(R^7)_d-Si(OR^5)_{3-c}R^6{}_c \tag{3}$$

wherein $R^3$ to $R^6$ may be the same or different and each represents a monovalent organic group; b and c may be the same or different and each is a number of 0 to 2; $R^7$ represents an oxygen atom, a phenylene group, or a group represented by $-(CH_2)_n-$, wherein n is an integer of 1 to 6; and d is 0 or 1; and (B) an organic solvent,
wherein the hydrolysis is conducted in the presence of from more than 20 mol to 150 mol of water per mol of the silane compounds.

2. The composition for film formation of claim 1, wherein the alkaline compound is selected from the group consisting of ammonia and organic amines.

3. The composition for film formation of claim 2, wherein the organic amines are alkylamines, alkanolamines, and arylamines.

4. The composition for film formation of claim 1, wherein the silane compounds comprise at least one compound represented by formula (1) and at least one compound represented by formula (2).

5. The composition for film formation of claim 1, which has a pH of 7 or lower.

6. A composition for film formation which comprises:

(A) a product of hydrolysis and condensation obtained by hydrolyzing and condensing one or more silane compounds selected from the group consisting of compounds represented by the following formula (1), compounds represented by the following formula (2), and compounds represented by the following formula (3) in the presence of an alkaline compound and from 20 to 150 mol of water per mol of the silane compounds, $$R_a Si(OR^1)_{4-a} \tag{1}$$

wherein R represents a hydrogen atom, a fluorine atom, or a monovalent organic group; $R^1$ represents a monovalent organic group; and a is an integer of 1 or 2;

$$Si(OR^2)_4 \tag{2}$$

wherein $R^2$ represents a monovalent organic group;

$$R^3{}_b(R^4O)_{3-b}Si-(R^7)_d-Si(OR^5)_{3-c}R^6{}_c \tag{3}$$

wherein $R^3$ to $R^6$ may be the same or different and each represents a monovalent organic group; b and c may be the same or different and each is a number of 0 to 2; $R^7$ represents an oxygen atom, a phenylene group, or a group represented by $-(CH_2)_n-$, wherein n is an integer of 1 to 6; and d is 0 or 1; and (B) an organic solvent.

7. A process for producing a composition for film formation which comprises hydrolyzing and condensing one or more silane compounds selected from the group consisting of compounds represented by the following formula (1), compounds represented by the following formula (2), and compounds represented by the following formula (3) in an organic solvent in the presence of 0.2 mol or more of an alkaline compound per mol of the silane compounds, $$R_a Si(OR^1)_{4-a} \tag{1}$$

wherein R represents a hydrogen atom, a fluorine atom, or a monovalent organic group; $R^1$ represents a monovalent organic group; and a is an integer of 1 or 2;

$$Si(OR^2)_4 \tag{2}$$

wherein $R^2$ represents a monovalent organic group;

$$R^3{}_b(R^4O)_{3-b}Si-(R^7)_d-Si(OR^5)_{3-c}R^6{}_c \tag{3}$$

wherein $R^3$ to $R^6$ may be the same or different and each represents a monovalent organic group; b and c may be the same or different and each is a number of 0 to 2; $R^7$ represents an oxygen atom, a phenylene group, or a group represented by $-(CH_2)_n-$, wherein n is an integer of 1 to 6; and d is 0 or 1.

8. A method of film formation which comprises applying the composition for film formation of claim 1 to a substrate and then heating the resultant coating.

9. A silica-based film obtained by the method of film formation of claim 8.

10. The composition for film formation of claim 1, wherein the alkaline compound is present in an amount of more than 0.2 mol per mol of the silane compounds.

11. The composition for film formation of claim 1, wherein the alkaline compound is present in an amount of 0.9 mol or more per mol of the silane compounds.

12. The composition for film formation of claim 1, wherein component (A) has a radius of gyration of 5 to 50 nm.

13. The composition for film formation of claim 12, wherein component (A) has a radius of gyration of 8 to 40 nm.

14. The composition for film formation of claim 13, wherein component (A) has a radius of gyration of 9 to 30 nm.

15. The silica-based film of claim 9, wherein no pores of 10 nm or larger are observed by a BJH method.

16. The silica-based film of claim 9, which has a dielectric constant is from 2.5 to 1.2.

* * * * *